US009165791B2

(12) United States Patent
Wu et al.

(10) Patent No.: US 9,165,791 B2
(45) Date of Patent: Oct. 20, 2015

(54) WIRELESS INTERCONNECTS IN AN INTERPOSER

(71) Applicant: QUALCOMM Incorporated, San Diego, CA (US)

(72) Inventors: Xiaoxia Wu, San Jose, CA (US); Yunqiang Yang, San Jose, CA (US); Chengjie Zuo, Santee, CA (US); Durodami Joscelyn Lisk, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 59 days.

(21) Appl. No.: 14/069,201

(22) Filed: Oct. 31, 2013

(65) Prior Publication Data

US 2015/0115405 A1    Apr. 30, 2015

(51) Int. Cl.
*H01L 23/522* (2006.01)
*H01L 21/48* (2006.01)
*H01L 49/02* (2006.01)
*H01L 23/538* (2006.01)
*H01L 23/498* (2006.01)

(52) U.S. Cl.
CPC .......... *H01L 21/486* (2013.01); *H01L 23/5383* (2013.01); *H01L 23/5384* (2013.01); *H01L 28/10* (2013.01); *H01L 23/49816* (2013.01)

(58) Field of Classification Search
CPC ................. H01L 2924/00; H01L 2224/16225; H01L 2924/15311; H01L 23/49827
USPC ............................ 257/531, E23.011; 336/200
See application file for complete search history.

(56) References Cited

U.S. PATENT DOCUMENTS

| 7,714,420 | B2 | 5/2010 | Gustat |
| 8,373,251 | B2 | 2/2013 | Uchida et al. |
| 2011/0291288 | A1* | 12/2011 | Wu et al. ........................ 257/774 |
| 2012/0228749 | A1* | 9/2012 | Pagaila .......................... 257/659 |
| 2013/0001742 | A1 | 1/2013 | Nakashiba |
| 2013/0020675 | A1* | 1/2013 | Kireev et al. ................. 257/531 |
| 2013/0099352 | A1* | 4/2013 | Yen et al. ...................... 257/531 |

OTHER PUBLICATIONS

Luan S., et al., "Towards an Inductively Coupled Power/Data Link for Bondpad-Less Silicon Chips," IEEE International Symposium on Circuits and Systems (ISCAS), IEEE, 2011, pp. 2597-2600.

* cited by examiner

*Primary Examiner* — David Vu
*Assistant Examiner* — Jonathan Han
(74) *Attorney, Agent, or Firm* — Loza & Loza, LLP

(57) ABSTRACT

Some implementations provide an interposer that includes a substrate, a first passive device in the substrate, and a second passive device. The first passive device includes a first set of through substrate vias (TSVs) in the substrate. The second passive device is configured to wirelessly couple to the first passive device. In some implementations, the second passive device includes a second set of through substrate vias (TSVs) in the substrate. In some implementations, the second passive device is configured to inductively couple to the first passive device. In some implementations, the first passive device is a first inductor and the second passive device is a second inductor. In some implementations, the interposer further includes a first set of interconnects coupled to the first set of TSVs, and a second set of interconnects coupled to the second set of TSVs.

17 Claims, 16 Drawing Sheets

WIRELESS INTERCONNECTS IN AN INTERPOSER

BACKGROUND

1. Field

Various features relate to a wireless interconnect in an interposer.

2. Background

An interposer is a routing component between a first connection and a second connection. For example, an interposer can be located between a die and a ball grid array (BGA). The interposer is configured to spread the pitch between connections and/or redirect a connection to a different connection.

FIG. 1 illustrates a semiconductor device configuration that includes a first die 100, a second die 102, an interposer 104, and a packaging substrate 106. As shown in FIG. 1, the first die 100 is coupled to the interposer 104 through a first set of solder balls 108. The second die 102 is coupled to the interposer 104 through a second set of solder balls 110. The interposer 104 includes a first set of interconnects 112 and a second set of interconnects 113. The set of interconnects 112 is configured to provide an electrical connection between the first die 100 and the second die 102. In particular, the first die 100 is electrically coupled to the second die 102 through the first set of solder balls 108, the set of interconnects 112, and the second set of solder balls 110.

The interposer 104 also includes a set of through substrate vias (TSVs) 114. The interposer 104 is coupled to the packaging substrate 106 through a third set of solder balls 116. The set of TSVs 114 is configured to provide an electrical connection between the first die 100 and the package substrate 106. As shown in FIG. 1, the first die 100 is electrically coupled to the packaging substrate 106 through the first set of solder balls 108, the second set of interconnects 113, the set of TSVs 114 and the third set of solder balls 116.

One of the downside of the semiconductor device configuration shown in FIG. 1 is the length of the electrical connection (e.g., routes, interconnects 112) between the first die 100 and the second die 102 in the interposer 104. Typically, long routes/electrical connections can lead to signal delays and signal loss. In addition, the electrical coupling between two dies that are logic dies will require many complex designs of routes and connections in the interposer 104 (e.g., several layers of interconnects). Such complex routing designs may often require many routing layers, which can lead to thick semiconductor devices.

Therefore, there is a need for a novel integrated/semiconductor device (e.g., interposer) that provides electrical connections between dies more efficiently, with less signal loss, and/or with less. signal delay. Ideally, such a novel integrated/semiconductor device will be thinner than current semiconductor devices.

SUMMARY

Various features, apparatus and methods described herein provide a wireless interconnect in an interposer.

A first example provides an interposer that includes a substrate, a first passive device in the substrate, and a second passive device. The first passive device includes a first set of through substrate vias (TSVs) in the substrate. The second passive device is configured to wirelessly couple to the first passive device.

According to an aspect, the second passive device includes a second set of through substrate vias (TSVs) in the substrate.

According to an aspect, the second passive device is in the substrate.

According to one aspect, the second passive device is configured to inductively couple to the first passive device. In some implementations, the second passive device is configured to inductively laterally couple to the first passive device. In some implementations, the second passive device is configured to inductively vertically couple to the first passive device.

According to an aspect, the second passive device is positioned laterally to the first passive device in the substrate.

According to one aspect, the second passive device is positioned vertically to the first passive device in the substrate.

According to an aspect, the first passive device is a first inductor and the second passive device is a second inductor.

According to one aspect, the interposer further includes a first set of interconnects coupled to the first set of TSVs, and a second set of interconnects coupled to the second set of TSVs. The first set of interconnects is configured to be coupled to a first die. The second set of interconnects is configured to be coupled to a second die.

According to an aspect, the interposer further includes a first die coupled to the substrate, and a second die coupled to the substrate. The second die is electrically coupled to the first die through the first and second set of TSVs. In some implementations, the interposer further includes a first active device coupled to the first die. The first active device is configured to transmit a signal. In some implementations, the interposer also includes a second active device coupled to the second die. The second active device is configured to receive the signal from the first active device. In some implementations, the first active device is one of at least a transmitter, receiver and/or transceiver.

According to one aspect, the interposer is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a substrate, a first passive means in the substrate, and a second passive means. The first passive means includes a first set of through substrate vias (TSVs) in the substrate. The second passive means is configured to wirelessly couple to the first passive means.

According to an aspect, the second passive means includes a second set of through substrate vias (TSVs) in the substrate.

According to an aspect, the second passive means is in the substrate.

According to one aspect, the second passive means is configured to inductively couple to the first passive means. In some implementations, the second passive means is configured to inductively laterally couple to the first passive means. In some implementations, the second passive means is configured to inductively vertically couple to the first passive means.

According to an aspect, the second passive means is positioned laterally to the first passive means in the substrate.

According to one aspect, the second passive means is positioned vertically to the first passive means in the substrate.

According to an aspect, the first passive means is a first inductor and the second passive means is a second inductor.

According to one aspect, the apparatus further includes a first set of interconnect means coupled to the first set of TSVs, and a second set of interconnect meanss coupled to the second set of TSVs. The first set of interconnect means is configured to be coupled to a first die. The second set of interconnect means is configured to be coupled to a second die.

According to an aspect, the apparatus further includes a first die coupled to the substrate, and a second die coupled to the substrate. The second die is electrically coupled to the first die through the first and second set of TSVs.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing an interposer. The method provides a substrate. The method provides a first set of interconnects on the substrate and a first set of through substrate vias (TSVs). The first set of interconnects and the first set of TSVs are configured to operate as a first passive device in the substrate. The method provides a second set of interconnects on the substrate. The second set of interconnects is configured to operate as a second passive device. The second passive device is configured to wirelessly couple to the first passive device.

According to an aspect, the method further provides a second set of through substrate vias (TSVs) in the substrate. The second passive device includes the second set of through substrate vias (TSVs) in the substrate.

According to one aspect, the second passive device is configured to inductively couple to the first passive device.

According to an aspect, the second passive device is configured to inductively laterally couple to the first passive device.

According to one aspect, the second passive device is configured to inductively vertically couple to the first passive device.

According to an aspect, the interposer is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

Figure 1:
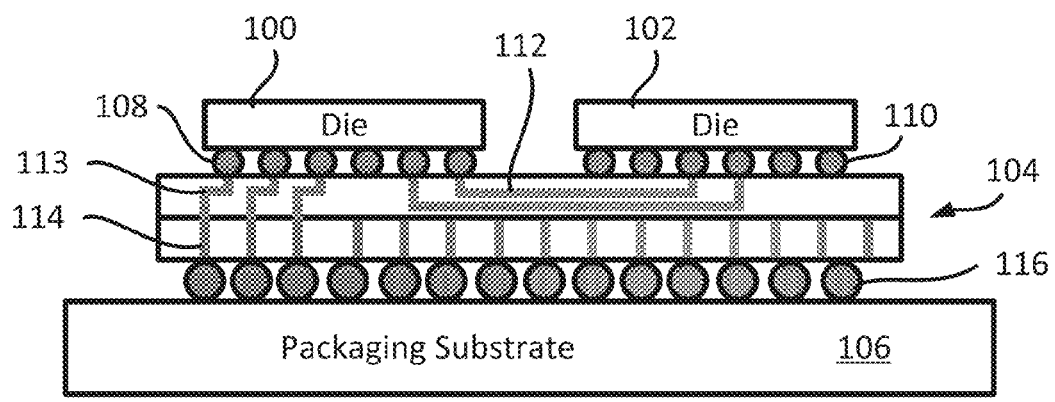
FIG. 1 illustrates a configuration of an interposer between a die and a package substrate.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., interposer) that includes a substrate, a first passive device in the substrate, and a second passive device. The first passive device includes a first set of through substrate vias (TSVs) in the substrate. The second passive device is configured to wirelessly couple to the first passive device. In some implementations, the second passive device includes a second set of through substrate vias (TSVs) in the substrate. In some implementations, the second passive device is configured to inductively couple to the first passive device. In some implementations, the second passive device is configured to inductively laterally couple to the first passive device. In some implementations, the second passive device is configured to inductively vertically couple to the first passive device. In some implementations, the second passive device is positioned laterally to the first passive device in the substrate. In some implementations, the second passive device is positioned vertically to the first passive device in the substrate. In some implementations, the first passive device is a first inductor and the second passive device is a second inductor. In some implementations, the interposer further includes a first set of interconnects coupled to the first set of TSVs, and a second set of interconnects coupled to the second set of TSVs. The first set of interconnects is configured to be coupled to a first die. The second set of interconnects is configured to be coupled to a second die. In some implementations, a first die is coupled to the substrate, and a second die is coupled to the substrate. The second die is electrically coupled to the first die through the first and second set of TSVs. In some implementations, the interposer further includes a first active device coupled to the first die. The first active device is configured to transmit a signal. In some implementations, the interposer also includes a second active device coupled to the second die. The second active device is configured to receive the signal from the first active device. In some implementations, the first active device is one of at least a transmitter, receiver and/or transceiver. In some implementations, the substrate includes a dielectric layer. In some implementations, the substrate is a laminate substrate that includes more than one dielectric layer. In some implementations, the substrate is a glass substrate. In some implementations, the substrate is a silicon substrate. In some implementations, the substrate is a wafer (e.g., silicon, glass).

Exemplary Interposer that Includes Wireless Interconnects

Figure 2:
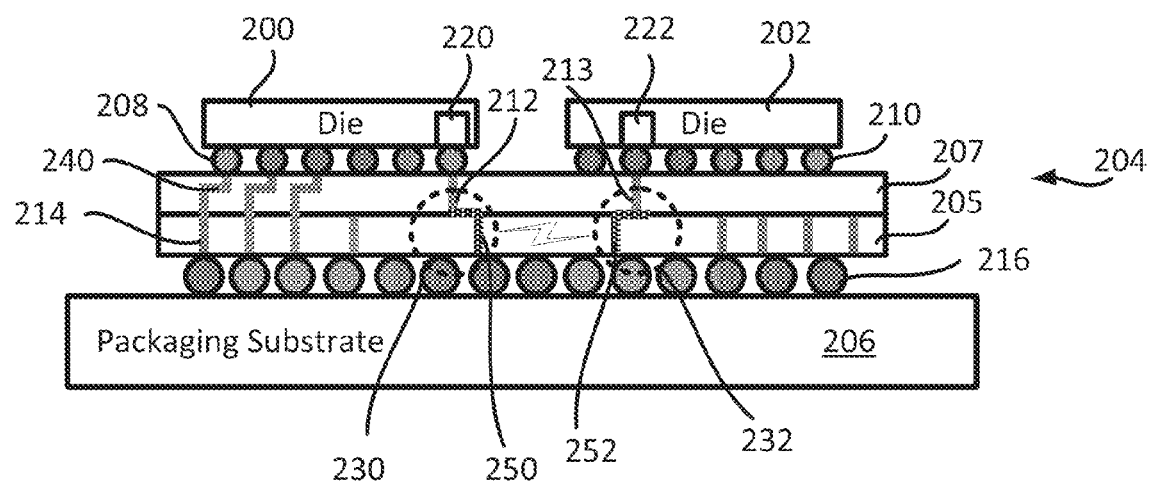
FIG. 2 illustrates a configuration of an interposer between a die and a package substrate, where the interposer includes passive devices.

FIG. 2 illustrates a novel integrated/semiconductor device (e.g., interposer, system-in-package, system in board, semiconductor device) that is configured to provide wireless coupling between two or more dies. Specifically, FIG. 2 provides a configuration that includes a first die 200, a second die 202, an interposer 204, and a packaging substrate 206. As shown in FIG. 2, the first die 200 is coupled to the interposer 204 through a first set of solder balls 208. The second die 202 is coupled to the interposer 204 through a second set of solder balls 210. The first die 200 includes a first active device 220 (e.g., first active means). The second die 202 includes a second active device 222 (e.g., second active means). The first active device 220 may include a first transceiver circuit and/or a first receiver circuit. The second active device 222 may include a second transceiver circuit and/or a second receiver circuit. In some implementations, the transceiver circuit and/or the receiver circuit may be configured to transmit and/or receive signals. An example of a transceiver circuit and receiver circuit will be further described in FIG. 16.

The interposer 204 includes a substrate 205 and a dielectric layer 207. In some implementations, the substrate 205 includes one of at least glass and/or silicon. In some implementations, the substrate 205 may be a laminated substrate that includes several dielectric layers. In some implementations, the dielectric layer 207 includes an oxide layer (e.g., silicon oxide), which is positioned on a first surface (e.g., top surface) of the substrate 205. In some implementations, another dielectric layer (not shown) may be positioned on a second surface (e.g., bottom surface) of the substrate 205. The interposer 204 also includes a first set of interconnects 212 (e.g. interconnects, vias), a second set of interconnects 213 (e.g. interconnects, vias), a first passive device 230 and a second passive device 232. In some implementations, the first passive device 230 is laterally located to the second passive device 232 in the substrate (e.g., first substrate layer 205) of the interposer 204. In some implementations, the first passive device 230 is configured to wirelessly couple to the second passive device 232. Examples of passive devices include an inductor. The wireless coupling (e.g., transmission, communication) between the first passive device 230 and the second passive device 232 is represented by a lightning bolt. In some implementations, the wireless coupling between the first passive device 230 and the second passive device 232 is an inductive coupling. The first passive device 230 is positioned laterally to the second passive device 232 in the substrate 205. In some implementations, the inductive coupling between the first passive device 230 and the second passive device 232 is a lateral inductive coupling. In some implementations, lateral inductive coupling may be defined as inductive coupling that is substantially (e.g., majority) or entirely between passive devices on the same layer (e.g., substrate 205) of the interposer 204.

The first passive device 230 may include a first set of through substrate vias (TSVs) 250. The first passive device 230 may also includes a first set of metal traces (e.g., interconnects) that is coupled to the first set of TSVs 250. The first set of metal traces may be located on a surface (e.g., top surface, bottom surface) of the substrate 205. The second passive device 232 may include a second set of through substrate vias (TSVs) 252. The second passive device 232 may also includes a second set of metal traces (e.g., interconnects) that is coupled to the second set of TSVs 252. The second set of metal traces may be located on the surface (e.g., top surface, bottom surface) of the substrate 205.

In some implementations, the first die 200 may be coupled to the second die 202 through the first active device 220, an interconnect material (e.g., solder ball 208), the first set of interconnects 212 (which may include vias and/or traces), the first passive device 230, the second passive device 232, the second set of interconnects 213 (which may include vias and/or traces), an interconnect material (e.g., solder ball 210), and the second active device 222. In some implementations, an electrical signal may be generated from the first active device 220 from the first die 200. The electrical signal may traverse from the first active device 220, through the interconnect material (e.g., solder ball 208), through the first set of interconnects 212 (which may include vias and/or traces) and to the first passive device 230. In some implementations, at the first passive device 230, the electrical signal is converted into a wireless signal (e.g., inductive signal). The converted wireless signal may then wirelessly traverse to the second passive device 232, where the wireless signal is converted back to an electrical signal. The electrical signal may then traverse from the second passive device 232 through the second set of interconnects 213 (which may include vias and/or traces), through the interconnect material (e.g., solder ball 210), and to the second active device 222 of the second die 202.

The interposer 204 also includes a third set of through substrate vias (TSVs) 214. The interposer 204 is coupled to the packaging substrate 206 through a third set of solder balls 216. In some implementations, the third set of TSVs 214 is configured to provide an electrical connection between the first die 200 and the package substrate 206. As shown in FIG. 2, the first die 200 is electrically coupled to the packaging substrate 206 through the first set of solder balls 208 (e.g., interconnect material), a third set of interconnects 240 (which may include vias and/or traces), the third set of TSVs 214 and the third set of solder balls 216 (e.g., interconnect materials).

It should be noted that the solder balls 208 and 216 (e.g., interconnect materials) of FIG. 2 are merely exemplary interconnect materials. In some implementations, other interconnect materials may be used (e.g., copper pillar and solder).

Figure 3:
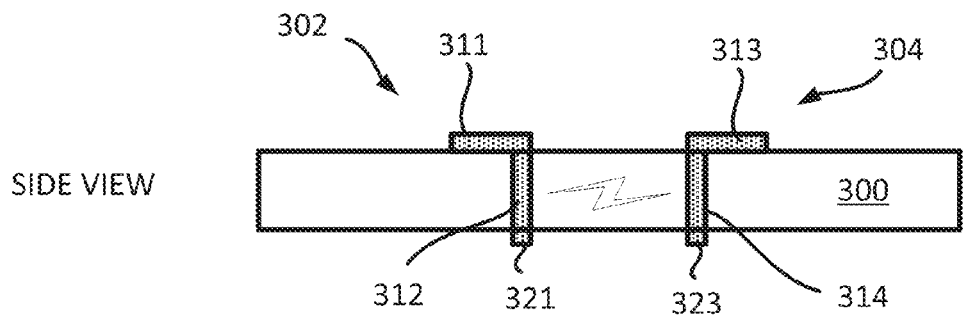
FIG. 3 illustrates a side view of an interposer that includes passive devices.
Figure 4:
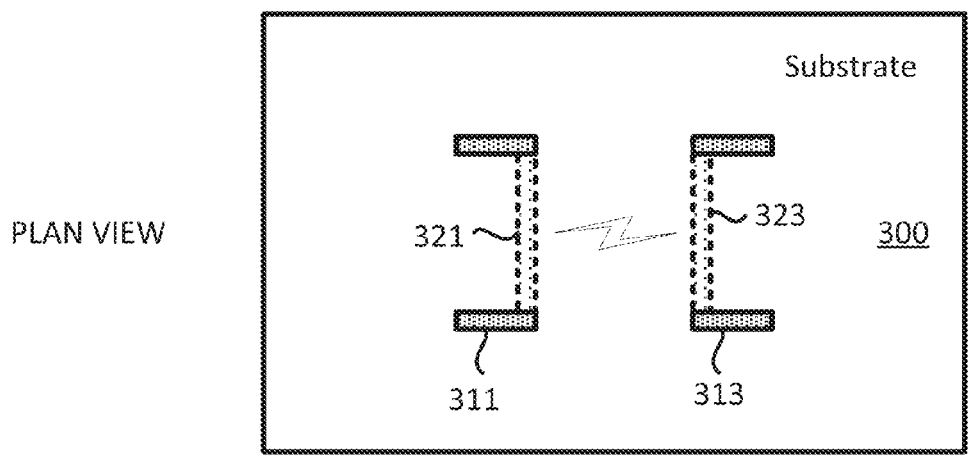
FIG. 4 illustrates a plan view of an interposer that includes passive devices.

FIGS. 3-4 illustrate a side view and a plan view (e.g., top view) of a substrate that includes passive devices. Specifically, FIG. 3 illustrates a side view of a substrate 300 that includes a first passive device 302 and a second passive device 304. In some implementations, the substrate 300 may be one of at least a glass and/or silicon substrate. In some implementations, the substrate 300 may be a laminated substrate (e.g., substrate that includes one or more dielectric layers). FIG. 4 illustrates a plan view (e.g., top view) of a substrate 300 that includes the first passive device 302 and the second passive device 304. The first passive device 302 is positioned laterally to the second passive device 304 in the substrate 300. The first passive device 302 is configured to wirelessly couple (e.g., inductively couple) to the second passive device 304. FIG. 3 illustrates a lateral wireless coupling of the first passive device 302 with the second passive device 304. The wireless coupling (e.g., transmission, communication) between the first passive device 302 and the second passive device 304 is represented by a lightning bolt.

The first passive device 302 includes a first set of interconnects 311 (e.g., metal traces), a first set of through substrate vias (TSVs) 312. The first set of interconnects 311 is located on a first surface (e.g., top surface) of the substrate 300. In some implementations, the first set of interconnects 311 may be embedded in the first surface (e.g., top surface) of the substrate 300. In some implementations, the first set of interconnects 311 is coupled to a first portion (e.g., top portion) of the first set of TSVs 312. The first passive device 302 may also include a second set of interconnects 321. The second set of interconnects 321 is located on a second surface (e.g., bottom surface) of the substrate 300. In FIG. 4, the second set of interconnects 321 are shown as dotted to illustrate that the second set of interconnects 321 is underneath the top surface of the substrate 300. In some implementations, the second set of interconnects 321 is embedded in the second surface (e.g., bottom surface) of the substrate 300. In some implementations, the second set of interconnects 321 is coupled to a second portion (e.g., bottom portion) of the first set of TSVs 312. In some implementations, the first set of interconnects 311, the second set of interconnects 321, and the first set of TSVs 312 are configured to operate as a first passive device (e.g., first passive device 302), such as an inductor and/or coupling inductor. However, in some implementations, the first passive device may include only the first set of interconnects 311 and the first set of TSVs 312. In some implementations, the first passive device may include several interconnects and several TSVs, as shown in FIG. 5.

The second passive device 304 includes a third set of interconnects 313 (e.g., metal traces) and a second set of through substrate vias (TSVs) 314. The third set of interconnects 313 are located on a first surface (e.g., top surface) of the substrate 300. In some implementations, the third set of interconnects 311 are embedded in the first surface (e.g., top surface) of the substrate 300. In some implementations, the third set of interconnects 313 are coupled to a first portion (e.g., top portion) of the second set of TSVs 314. The second passive device 304 may also include a fourth set of interconnects 323. In FIG. 4, the fourth set of interconnects 323 is shown as dotted to illustrate that the fourth set of interconnects 323 is underneath the top surface of the substrate 300. The fourth set of interconnects 323 are located on a second surface (e.g., bottom surface) of the substrate 300. In some implementations, the fourth set of interconnects 323 is embedded in the second surface (e.g., bottom surface) of the substrate 300. In some implementations, the fourth set of interconnects 323 is coupled to a second portion (e.g., bottom portion) of the second set of TSVs 314. In some implementations, the third set of interconnects 313, the fourth set of interconnects 323, and the second set of vias 314 are configured to operate as a second passive device (e.g., second passive device 304). However, in some implementations, the second passive device may include only the third set of interconnects 313 and the second set of TSVs 314. In some implementations, the second passive device may include several interconnects and several TSVs, as shown in FIG. 5.

It should be noted that in some implementations, one or more dielectric layers (not shown) may cover the top surface and/or bottom surface of the substrate 300 shown in FIGS. 3-4. In such instances, the dielectric layer(s) may also cover a portion or all of the interconnects (e.g., interconnect 311, interconnect 323) on the substrate 300.

Figure 5:
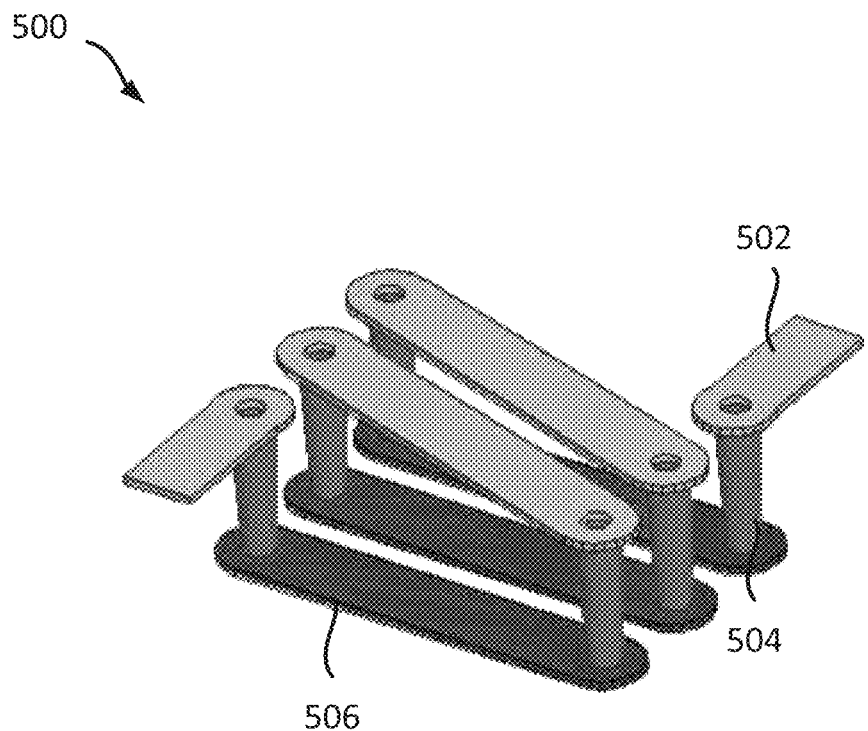
FIG. 5 illustrates an angled view of a passive device that includes a set of interconnects and a set of through substrate via (TSVs).

FIG. 5 illustrates an example of a passive device that may be implemented in a substrate (e.g., interposer). Specifically, FIG. 5 illustrates an angled view of passive device 500 (e.g., inductor, inductive means, passive means) that includes a first set of interconnects 502, a set of through substrate vias (TSVs) 504, and a second set of interconnects 506. In some implementation, the first and second sets of interconnects 502 & 506 may be metal traces. It should be noted that the substrate is not shown in FIG. 5.

In some implementations, the first set of interconnects 502 is configured to be positioned on a first surface (e.g., top surface) of the substrate. In some implementations, the second set of interconnects 506 is configured to be positioned on a second surface (e.g., bottom surface) of the substrate. As shown in FIG. 5, the first set of interconnects 502 is coupled to the second set of interconnects 506 through the set of TSVs 504. Although multiple interconnects and TSVs are shown, in some implementations, a passive device may include one interconnect and one TSV. However, as will be further described below, a passive device may only include an interconnect in some implementations. In some implementations, several passive devices 500 may be implemented in a substrate (e.g., interposer). Two of these passive devices may be positioned near each other in order to provide coupling inductors, which may be used for wireless communication (e.g., wireless interconnects). It should be noted that the passive device 500 shown in FIG. 5 is merely an example of an arrangement and/or configuration of interconnects and TSVs. Different implementations may user different arrangements and/or configurations to provide one or more passive devices. It should also be noted that portions of the interconnects may be covered with one or more dielectric layers (which is not shown).

FIGS. 2, 3 and 4 illustrate an example of substrate that includes passive devices, where wireless coupling (e.g., communication, transmission, reception) occurs laterally (e.g., majority lateral coupling, substantial lateral coupling) between a first passive device and a second passive device in a substrate. However, in some implementations, wireless coupling may also occur vertically (e.g., vertical wireless coupling).

Figure 6:
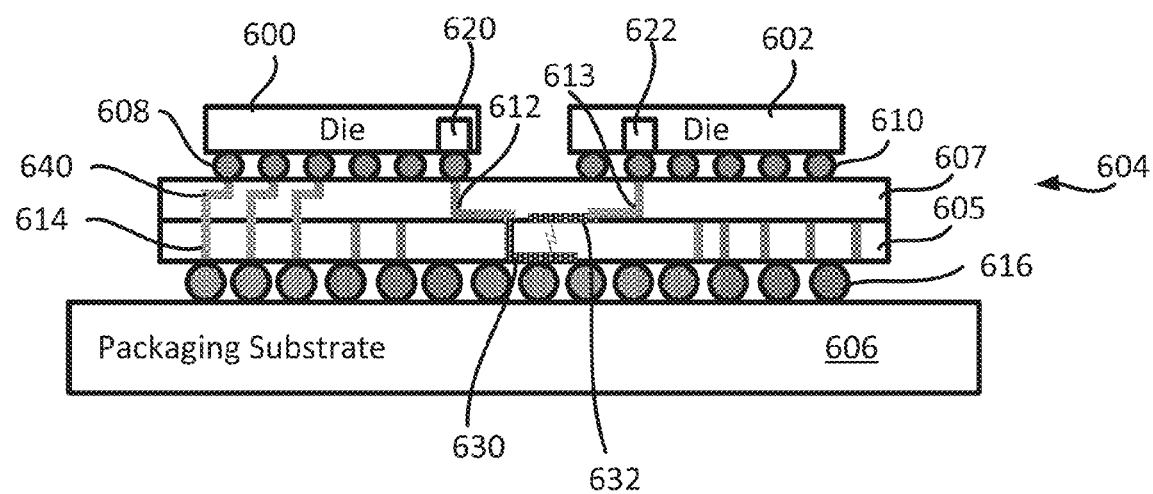
FIG. 6 illustrates a configuration of an interposer between a die and a package substrate, where the interposer includes passive devices.

Exemplary Interposer that Includes Wireless Interconnects with Vertical Coupling FIG. 6 illustrates an example of a substrate that includes passive devices, where wireless coupling occurs vertically (e.g., majority vertical coupling, substantial vertical coupling) between a first passive device and a second passive device.

In particular, FIG. 6 illustrates a novel integrated/semiconductor device (e.g., interposer, system-in-package, system in board) that is configured to provide wireless coupling between two or more dies. Specifically, FIG. 6 provides a configuration that includes a first die 600, a second die 602, an interposer 604, and a packaging substrate 606. As shown in FIG. 6, the first die 600 is coupled to the interposer 604 through a first set of solder balls 608. The second die 602 is coupled to the interposer 604 through a second set of solder balls 610. The first die 600 includes a first active device 620 (e.g., first active means). The second die 602 includes a second active device 622 (e.g., second active means). The first active device 620 may include a first transceiver circuit and/or a first receiver circuit. The second active device 622 may include a second transceiver circuit and/or a second receiver circuit. In some implementations, the transceiver circuit and/or the receiver circuit may be configured to transmit and/or receive signals. An example of a transceiver circuit and receiver circuit will be further described in FIG. 16.

The interposer 604 includes a substrate 605 and a dielectric layer 607. In some implementations, the substrate 605 includes one of at least glass and/or silicon. In some implementations, the substrate 605 may be a laminated substrate that includes several dielectric layers. In some implementations, the dielectric layer 607 includes an oxide layer (e.g., silicon oxide). The interposer 604 also includes a first set of interconnects 612, a second set of interconnects 613, a first passive device 630 and a second passive device 632. In some implementations, the first passive device 630 is vertically (e.g., partially, substantially) located to the second passive device 632 in the substrate (e.g., first substrate layer 605) of the interposer 604. In some implementations, the first passive device 630 is configured to wirelessly couple to the second passive device 632. Examples of passive devices include an inductor. The wireless coupling (e.g., transmission, communication) between the first passive device 630 and the second passive device 632 is represented by the lightning bolt. In some implementations, the wireless coupling between the first passive device 630 and the second passive device 632 is an inductive coupling. The first passive device 630 is positioned vertically (e.g., partially, substantially) to the second passive device 632 in the substrate 605. In some implementations, the inductive coupling between the first passive device 630 and the second passive device 632 is a vertical inductive coupling. In some implementations, vertical inductive coupling may be defined as inductive coupling that is substantially (e.g., majority) or entirely between passive devices on the different layers (e.g., different surfaces of a substrate) of the interposer (e.g., interposer 604).

The first passive device 630 may include a first set of through substrate vias (TSVs). The first passive device 630 may also includes a first set of metal traces (e.g., interconnects) that is coupled to the first set of TSVs. The first set of metal traces may be located on a surface (e.g., top surface, bottom surface) of the substrate 605. The second passive device 632 may include a second set of through substrate vias (TSVs). The second passive device 632 may also includes a second set of metal traces (e.g., interconnects) that is coupled to the second set of TSVs. The second set of metal traces may be located on the surface (e.g., top surface, bottom surface) of the substrate 605.

In some implementations, the first die 600 may be coupled to the second die 602 through the first active device 620, the interconnect material (e.g. solder balls 608), the first set of interconnects 612 (e.g., vias and/or traces), the first passive device 630, the second passive device 632, the second set of interconnects 613 (e.g., vias and/or traces), interconnect material (e.g., solder balls 610), and the second active device 622. In some implementations, an electrical signal may be generated from the first active device 620 from the first die 600. The electrical signal may traverse from the first active device 620, through the interconnect material (e.g., solder ball 608), through the first set of interconnects 612 and to the first passive device 630. In some implementations, at the first passive device 630, the electrical signal is converted into a wireless signal (e.g., inductive signal). The converted wireless signal may then wirelessly traverse to the second passive device 632, where the wireless signal is converted back to an electrical signal. The electrical signal may then traverse from the second passive device 632 through the second set of interconnects 613, through the interconnect material (e.g., solder ball 610), and to the second active device 622 of the second die 602.

The interposer 604 also includes a third set of through substrate vias (TSVs) 614. The interposer 604 is coupled to the packaging substrate 606 through a third set of solder balls 616. In some implementations, the third set of TSVs 614 is configured to provide an electrical connection between the first die 600 and the package substrate 606. As shown in FIG. 6, the first die 600 is electrically coupled to the packaging substrate 606 through the first set of solder balls 608, a third set of interconnects 640, the third set of TSVs 614 and the third set of solder balls 616.

Figure 7:
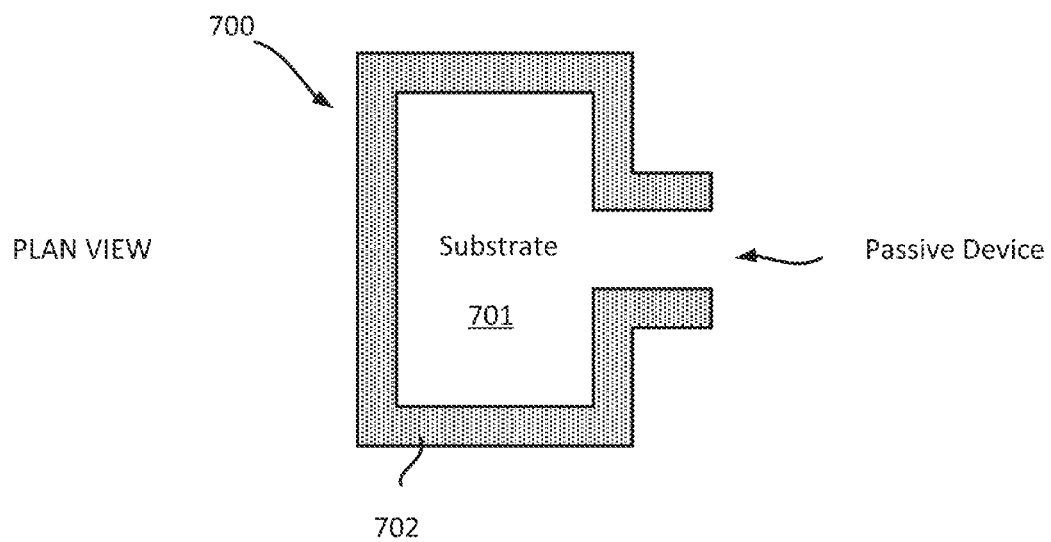
FIG. 7 illustrates a side view of passive device on an interposer.
Figure 8:
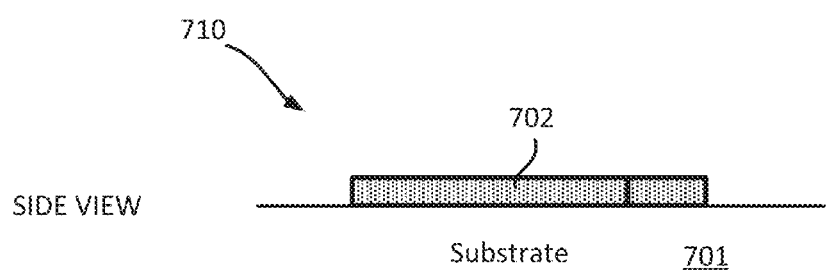
FIG. 8 illustrates a plan view of passive device on an interposer.

FIGS. 7-8 illustrate a plan view (e.g., top view) and a side view of a passive device. Specifically, FIG. 7 illustrates a plan view of a passive device 700 on a substrate 701. The substrate 701 is part of an integrated device (e.g., interposer). In some implementations, the passive device 700 is in the integrated device (e.g., interposer). The passive device 700 includes a first set of interconnects 702 (e.g., metal traces). The first set of interconnects 702 may be a set of windings for the passive device 700. As shown in FIG. 8, the first set of interconnects 702 are located on a first surface (e.g., top surface) of the substrate 701. In some implementations, the first set of interconnects 702 are embedded in the first surface (e.g., top surface) of the substrate 701. In some implementations, the passive device 701 is the second passive device 632 of FIG. 6.

Figure 9:
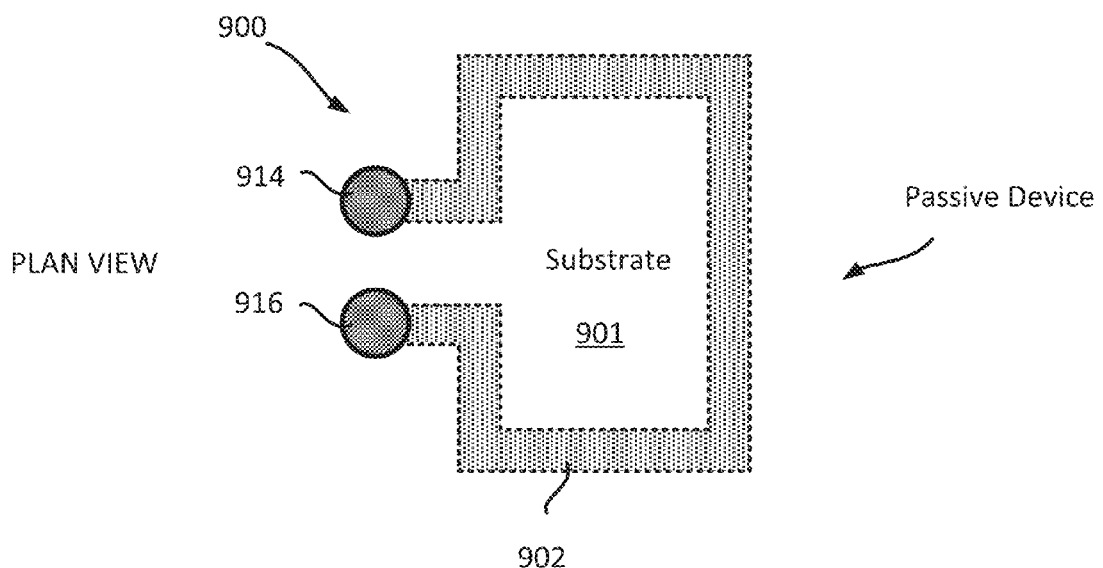
FIG. 9 illustrates a side view of passive device in an interposer.
Figure 10:
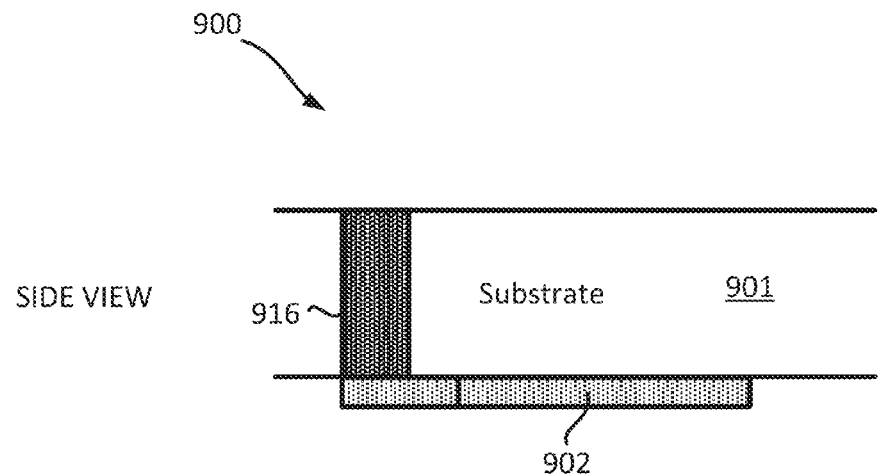
FIG. 10 illustrates a plan view of passive device in an interposer.

FIGS. 9-10 illustrate a plan view (e.g., top view) and a side view of another passive device. FIG. 9 illustrates a plan view of another passive device 900 in the substrate 901. The substrate 901 is part of an integrated device (e.g., interposer). In some implementations, the passive device 900 is in the integrated device (e.g., interposer). The passive device 900 includes a first set of interconnects 902 (e.g., metal traces), a first through substrate via (TSV) 914, and a second through substrate via (TSV) 916. The first set of interconnects 902 may be a set of windings for the passive device 900. As shown in FIG. 10, the first set of interconnects 902 are located on a second surface (e.g., bottom surface) of the substrate 901. In some implementations, the first set of interconnects 902 are embedded in the second surface (e.g., bottom surface) of the substrate 901. In FIG. 9, the first set of interconnects 902 are shown as dotted to indicate that the first set of interconnects 902 are underneath a top surface of the substrate 901. As further shown in FIG. 9, the first TSV 914 and the second TSV 916 are coupled to the first set of interconnects 902. In some implementations, the passive device 900 is the first passive device 630 of FIG. 6.

It should be noted that shapes and configuration of the passive devices (e.g., passive devices 700, 900) may have different sizes and shapes, and is not limited to the sizes and shapes shown in FIGS. 7-8 and FIGS. 9-10. For example, the shapes of the interconnects may be circular and/or oval.

Figure 11:
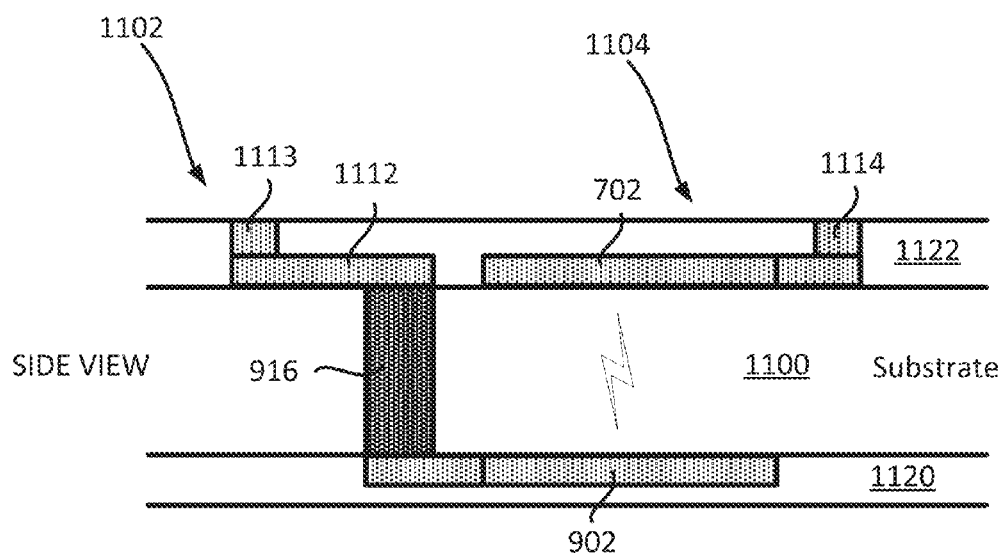
FIG. 11 illustrates a side view of two passive devices in an interposer.

FIG. 11 illustrates an example of the passive devices described in FIGS. 7-10 implemented in a substrate (e.g., interposer). Specifically, FIG. 11 illustrates a substrate 1100, a first passive device 1102, and a second passive device 1104. In some implementations, the substrate 1100 is part of an integrated device (e.g., interposer). In some implementations, the first passive device 1102, and the second passive device 1104 are configured for vertical coupling (as illustrated by the lightning bolt).

The first passive device 1102 includes the interconnect 902 and the through substrate via (TSV) 916. The interconnect 902 (e.g., trace) is located on a first surface (e.g., bottom surface) of the substrate 1100. The interconnect 902 is covered by a first dielectric layer 1120. The interconnect 902 is coupled to the TSV 916. The first passive device 1102 also includes another interconnect 1112. The interconnect 1112 is positioned on a second surface (e.g., top surface) of the substrate 1100. The interconnect 1112 is coupled to the TSV 916. The first passive device 1102 also includes a via 1113. The via 1113 is coupled to the interconnect 1112. As shown in FIG. 11, the interconnect 1112 is covered by a second dielectric layer 1122.

The second passive device 1104 includes the interconnect 702. The interconnect 702 (e.g., trace) is located on the second surface (e.g., top surface) of the substrate 1100. The interconnect 702 is coved by the second dielectric layer 1122. The second passive device 1104 also includes another via 1114. The via 1114 is coupled to the interconnect 702.

It should be noted that in some implementations, the first and second dielectric layers 1120 and 1122 may be optional.

It should also be noted that the above novel integrated device is not limited to an interposer. In some implementations, the novel integrated device may be implemented in a system in package (SiP) and/or system in board. In some implementations, the configuration shown in FIGS. 2, 3, 4, and 6 provides an integrated device (e.g., interposer, system-in-package, system in board) that can provide high bandwidth communication, low signal loss, and reduce routing layers, which can result in a thinner device (e.g., interposer, system-in-package, system in board).

Figure 12:
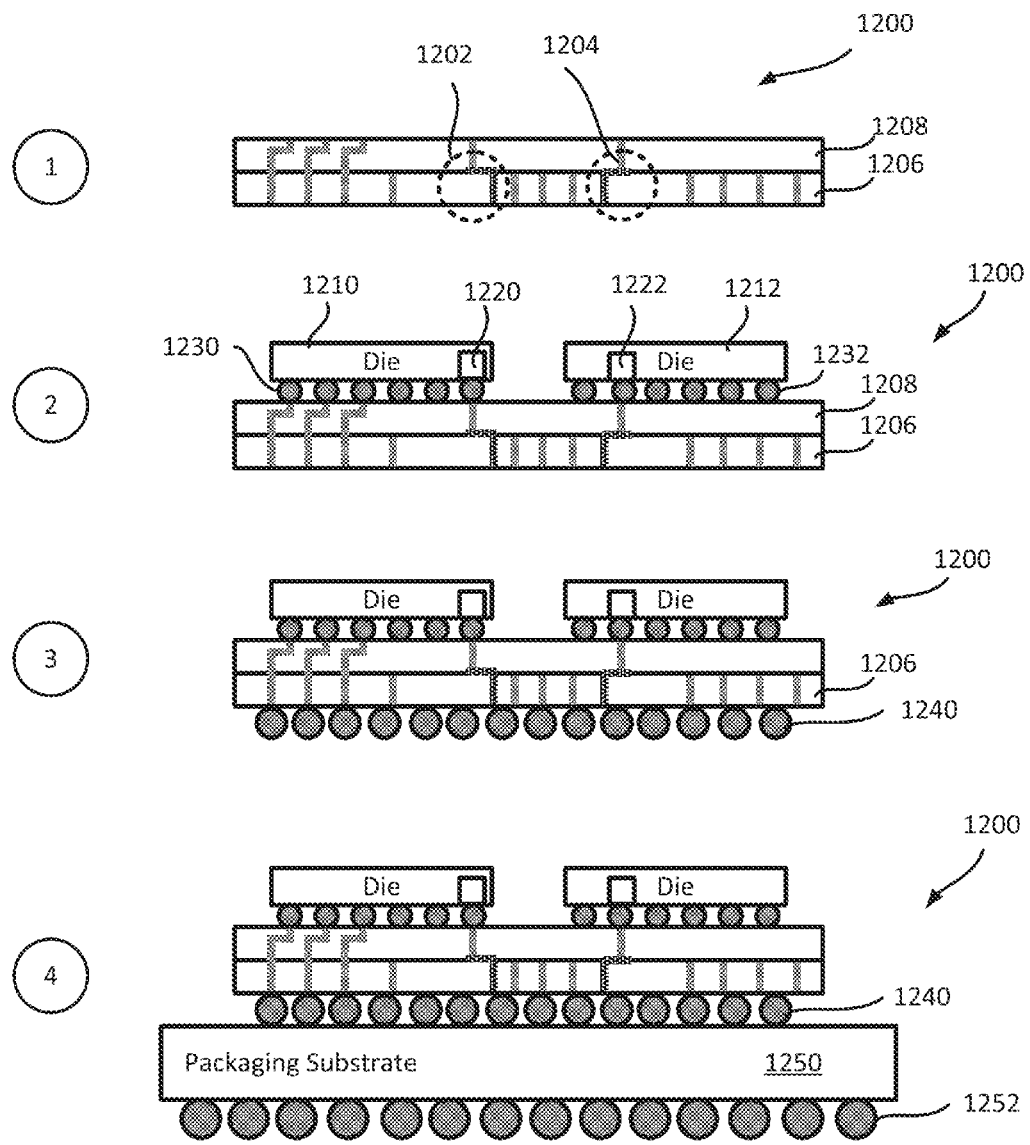
FIG. 12 illustrates a sequence for providing/manufacturing a configuration of an interposer between a die and a package substrate, where the interposer includes passive devices.

Exemplary Sequence for Providing/Manufacturing a Package that Includes Interposer that Includes Wireless Interconnects FIG. 12 illustrates an exemplary sequence for providing/manufacturing a package that includes an interposer that has wireless interconnects.

As shown in FIG. 12, at stage 1, an interposer 1200 is provided. The interposer 1200 includes a first passive device 1202 and a second passive device 1204. The interposer also includes a substrate 1206 and a dielectric layer 1208. The first passive device 1202 and the second passive device 1204 are in the substrate 1206. In some implementations, the substrate 1206 is one of glass and/or silicon. In some implementations, the substrate 1206 may be a laminated substrate (e.g., substrate that includes several dielectric layers). The substrate 1206 includes a set of through substrate vias (TSVs). In some implementations, another substrate (not shown) may be coupled to another surface (e.g., bottom surface) of the substrate 1206.

The first passive device 1202 is configured to wirelessly couple to the second passive device 1204. The first passive device 1202 includes a first set of interconnects (e.g., metal traces) and a first set of through substrate vias (TSVs). The second passive device 1204 includes a second set of interconnects (e.g., metal traces) and a second set of through substrate vias (TSVs). The first passive device 1202 and the second passive device 1204 are inductors (e.g., coupling inductors) in some implementations.

At stage 2, a first die 1210 and a second die 1212 are coupled to the interposer 1200. The first die 1210 includes a first active device 1220. The second die 1212 includes a second active device 1222. In some implementations, the first active device 1220 is one of at least a transmitter, a receiver, and/or a transceiver. In some implementations, the second active device 1222 is one of at least a transmitter, a receiver, and/or a transceiver. The first active device 1220 and the second active device 1222 are configured to transmit and/or receive signals. The first active device 1220 is coupled to the interposer 1200 through a set of interconnect materials 1230 (e.g., solder balls, copper pillar). The second active device 1222 is coupled to the interposer 1200 through a set of interconnect materials 1232 (e.g., solder balls, copper pillar). As shown at stage 2, the first active device 1220 is coupled to the first passive device 1202, and the second active device 1222 is coupled to the second passive device 1204.

At stage 3, a set of interconnect material 1240 (e.g., solder balls) are coupled to the interposer 1200. As shown at stage 3, the set of interconnect material 1240 are coupled to a bottom surface of the substrate 1206.

At stage 4, a package substrate 1250 is coupled to the interposer 1200 through the set of interconnect material 1240. The package substrate 1250 is coupled to a set of interconnect material 1252 (e.g., solder balls). In some implementations, the set of interconnect material 1252 is configured to be coupled to a printed circuit board (PCB).

Figure 13A:
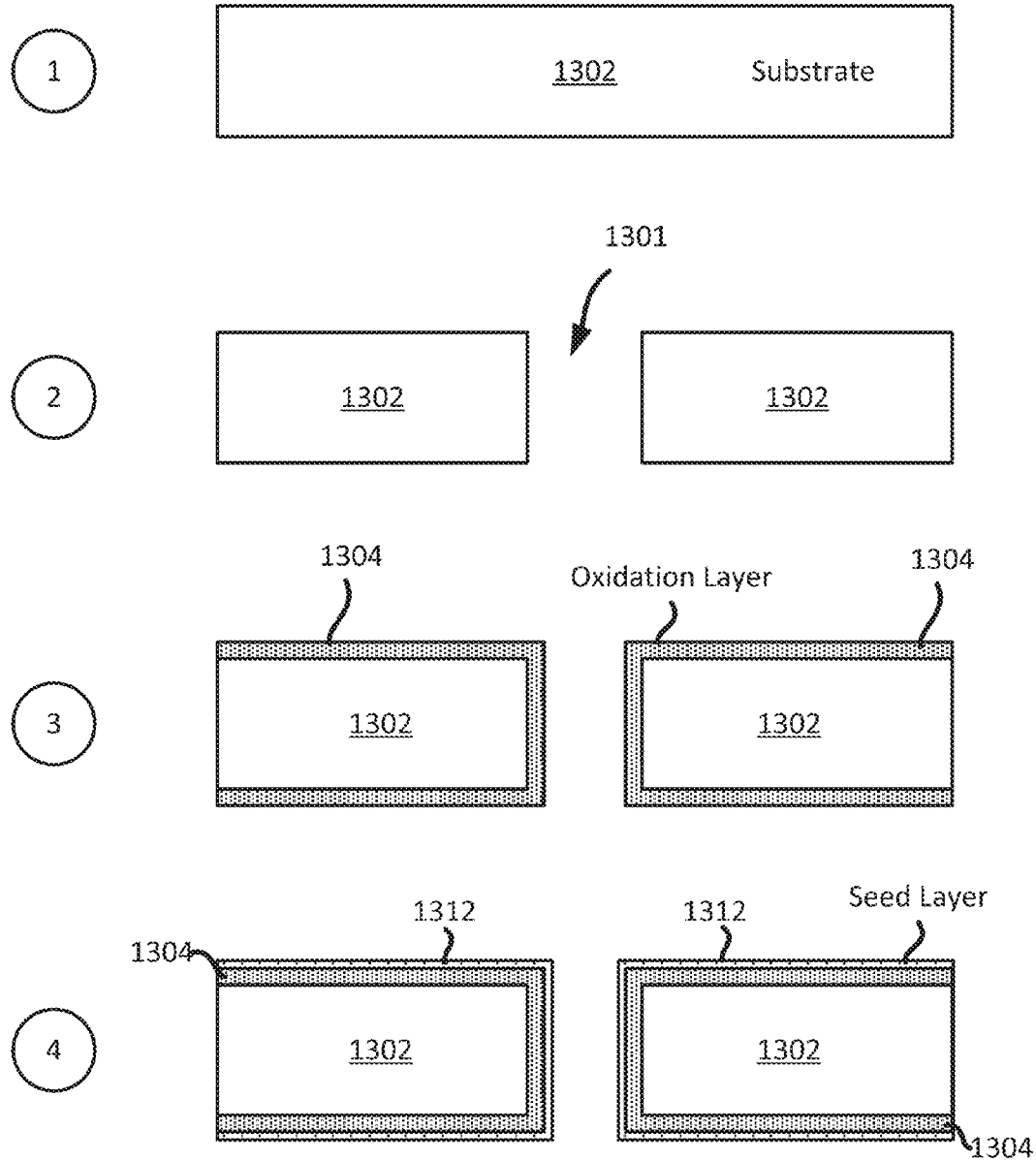
FIGS. 13A-13C illustrate a sequence for providing/manufacturing an interposer that includes a passive device.
Figure 13B:
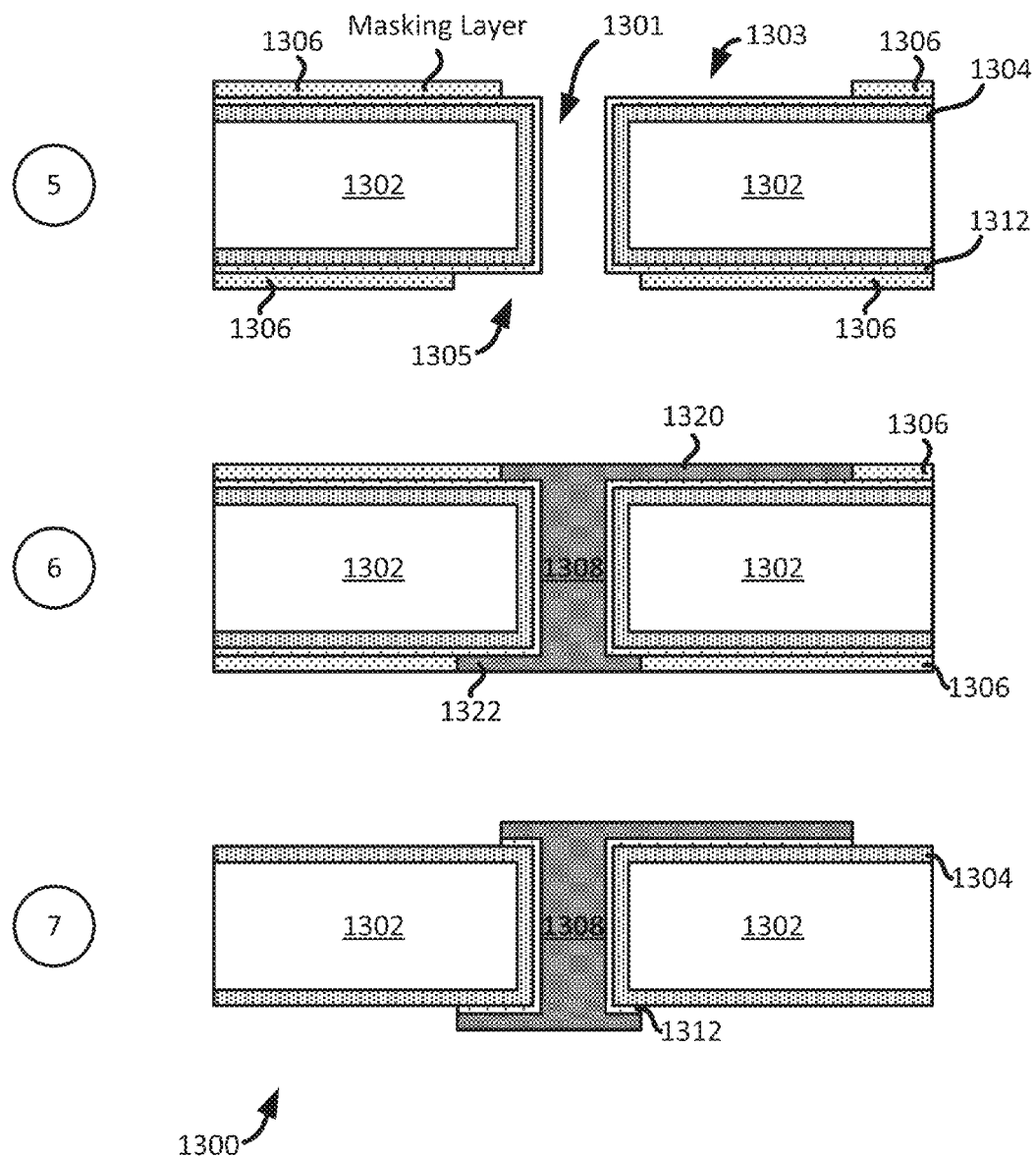
Figure 13C:
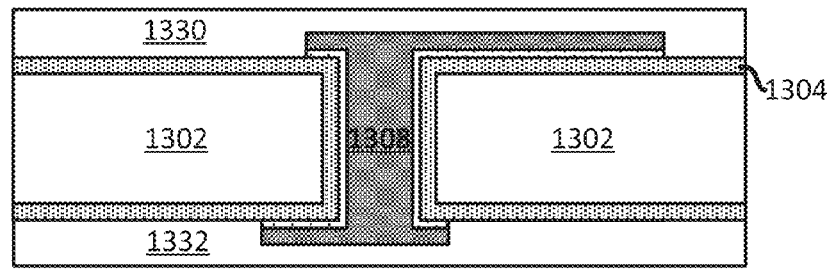
Figure 13C:
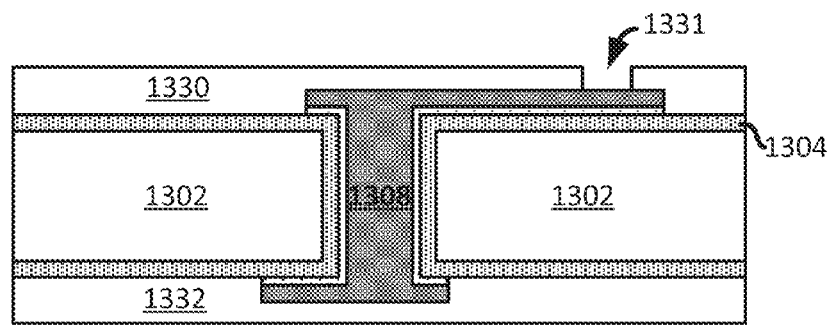
Figure 13C:
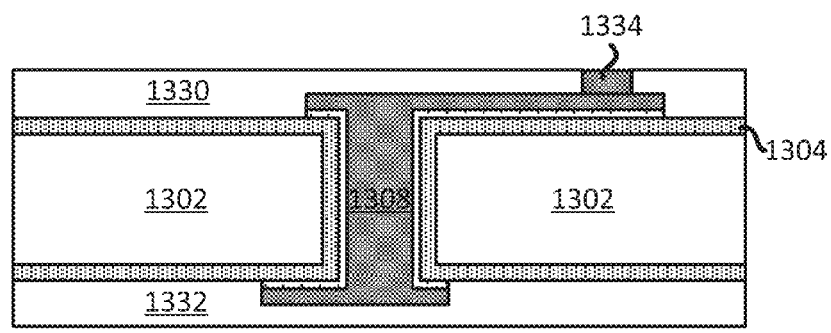

Exemplary Sequence for Providing/Manufacturing an Interposer that Includes Wireless Interconnects FIGS. 13A-13C illustrate an exemplary sequence for providing/manufacturing an interposer that includes wireless interconnect. Specifically, FIGS. 13A-13B illustrate a sequence for providing/manufacturing an interposer that includes at least one passive device (e.g., inductor) that includes a through substrate via (TSVs).

As shown in FIG. 13A, a substrate 1302 is provided (at stage 1). In some implementations, the substrate 1302 is a silicon substrate. In some implementations, the substrate 1302 is a glass substrate. In some implementations, the substrate 1302 may include one or more metal layers on one or more surface of the substrate 1302. In some implementations, the substrate 1302 is a wafer substrate. At stage 2, a cavity 1301 is created in the substrate 1302. Different implementations may use different techniques and processes for creating the cavity 1301. In some implementations, the cavity 1301 is created by using a laser to drill the cavity 1301 in the substrate 1302. In some implementations, the cavity 1301 is created by using pattern etching (e.g., lithography, chemical process). Stage 2 illustrates one cavity 1301 being created. However, in some implementations, multiple cavities may be created (sequentially and/or concurrently).

At stage 3, an oxidation layer 1304 is optionally provided on the substrate 1302. In some implementations, the oxidation layer 1304 it provided on an exposed surface of the substrate 1302. Different implementations may provide the oxidation layer 1304 differently. In some implementations, the oxidation layer 1304 is provided by exposing the substrate 1302 to an oxidizing material (e.g., air, water, $O_3$, chemical), which forms the oxidation layer 1304 (e.g., silicon oxide) on the surface of the substrate 1302. In some implementations, the substrate 1302 may be exposed to heat under an oxidation environment (e.g., in a furnace) to form the oxidation layer 1304 (e.g., thermal oxide). In some implementations, the oxidation layer 1304 is provided on a first surface (e.g., top surface) of the substrate 1302 during a first exposure of the substrate 1302 to heat under an oxidation environment (e.g., in a furnace) and then the oxidation layer 1304 is provided on a second surface (e.g., bottom surface) of the substrate 1302 during a second exposure of the substrate 1302 to heat under an oxidation environment (e.g., in furnace). In some implementations, the oxidation layer 1304 is provided on the entire surface of the substrate 1302 during a single exposure of the substrate 1302 to heat under an oxidation environment (e.g., in a furnace). The oxidation layer 1304 may be a liner in some implementations.

It should be noted that in some implementations, stage 3 may be bypassed. That is, in some implementations, the oxidation layer 1304 is not provided. For example, when the substrate 1302 is a glass substrate, the oxidation layer 1304 may not be provided on the substrate 1302.

At stage 4, a seed layer 1312 is provided on the interposer. Specifically, a seed layer 1312 is provided on the oxidation layer 1304. In some implementations, when there is no oxidation layer 1304, the seed layer 1312 is provided on the surface of the substrate 1302. Different implementations may use different materials for the seed layer 1312. In some implementations, the seed layer 1312 is a metal layer (e.g., copper layer). For example, the seed layer 1312 may be an electrodeless copper seed layer. In some implementations, the seed layer 1312 may be provided using physical vapor deposition or chemical vapor deposition.

At stage 5, one or more portions of the masking layer 1306 are selectively provided on the seed layer 1312. Different implementations may use different methods for selectively providing the masking layer 1306. In some implementations, providing the masking layer 1306 includes providing a patterned mask layer on one or more surface of the interposer (e.g., top surface, bottom surface). In some implementations, providing the masking layer 1306 may include etching the masking layer 1306. In some implementations, lithography may be used to selectively etch the masking layer 1306. As shown at stage 5, portions of the masking layer 1306 are provided (and etched) to form a pattern/cavity (e.g., cavities 1303, 1305) that will define the outline of one or more vias or portions of one or more vias.

At stage 6, a metal layer is provided in the cavities 1301, 1303 and 1305. In some implementations, providing the metal layer in the cavity 1301 defines a via 1308 (e.g., through substrate via (TSV)) in the substrate 1302 of the interposer. In some implementations, providing the metal layer in the cavity 1303 defines a first interconnect 1320 on a first surface (e.g., top surface) on the substrate 1302 of the interposer. In some implementations, providing the metal layer in the cavity 1305 defines a second interconnect 1322 on a second surface (e.g., bottom surface) on the substrate 1302 of the interposer. Different implementations may provide the metal layer differently. In some implementations, the metal layer may be deposited, plated and/or pasted in the cavities 1301, 1303 and 1305.

In some implementations, the first interconnect 1320, the TSV 1308, and/or the second interconnect 1322 are configured to operate as a passive device (e.g., inductor) in some implementations.

At stage 7, the masking layer 306 is removed, leaving an interposer 1300 with an oxidation layer 1304 (optional), a TSV 1308, a first interconnect 1320, and a second interconnect 1322. In some implementations, removing the masking layer 1306 includes removing portions of the seed layer 1312 (e.g., portions of an electrodeless seed layer). In some implementations, portions of the seed layer 1312 between the TSV 1308 and the oxidation layer 1304 may remain. In some implementations, the seed layer 1312 may be the same material as the metal layer forming TSV 1308. In such instances, the metal layer forming TSV 1308 may be indistinguishable from the seed layer 1312. In some implementations, the TSV 1308 may include the seed layer 1312.

At stage 8, a first dielectric layer 1330 and a second dielectric layer 1332 is provided. Specifically, the first dielectric layer 1330 is provided on a first surface (e.g., top surface) of the substrate 1302. As shown at stage 8, the first dielectric layer 1330 is provided on the oxidation layer 1304, the TSV 1308, and the first interconnect 1320. The second dielectric layer 1332 is provided on a second surface (e.g., bottom surface) of the substrate 1302. Specifically, the second dielectric layer 1332 is provided on the oxidation layer 1304, the TSV 1308, and the second interconnect 1322.

At stage 9, a cavity 1331 is created in the first dielectric layer 1330. Specifically, the first cavity 1331 is created over a portion of the first interconnect 1320.

At stage 10, the cavity 1331 is filled with a metal layer. When the cavity 1331 is filled with the metal layer (e.g., copper), it defines a via 1334. In some implementations, the via 1334 is coupled to the first interconnect 1320. In addition, the via 1334 is configured to be coupled to a die (e.g., solder balls of a die).

In some implementations, the interposer 1300 may be configured to be positioned between a printed circuit board (PCB) and at least one die. For example, the novel interposer 1300 may replace the interposer 204 of FIG. 2 in some implementations.

Figure 14:
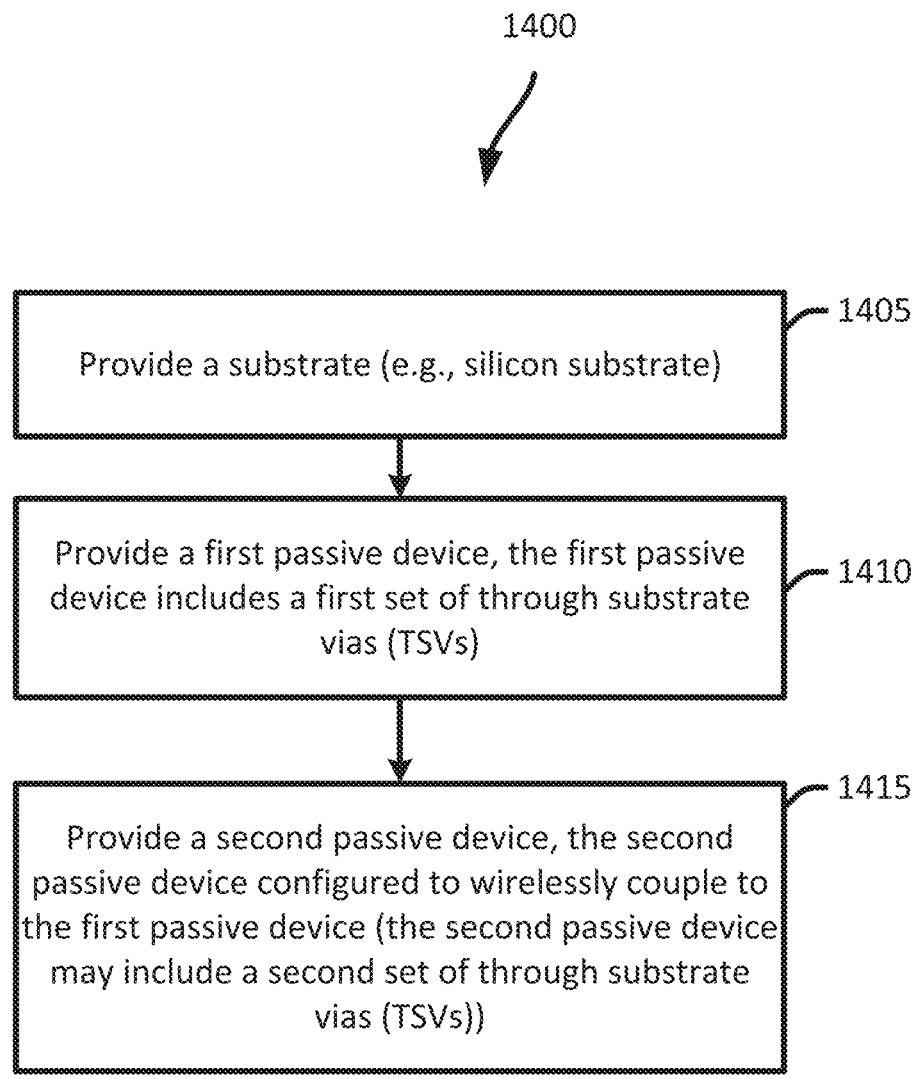
FIG. 14 illustrates a method for providing/manufacturing an interposer that includes a passive device.

Exemplary Method for Providing/Manufacturing an Interposer that Includes Wireless Interconnects FIG. 14 illustrates an exemplary method for providing/manufacturing an interposer that includes a wireless interconnect. Specifically, FIG. 14 illustrates a sequence for providing/manufacturing an interposer that includes at least one passive device (e.g., inductor, inductive means, passive means), where the passive device includes a through substrate via (TSV).

In some implementations, the method of FIG. 14 may be used to provide/manufacture the integrated devices (e.g., interposers) of FIGS. 2, 3, 4, 6 and/or 13A-13C, as well as other integrated devices (e.g., interposers) described in the present disclosure. As shown in FIG. 14, the method provides (at 1405) a substrate. In some implementations, the substrate is a silicon substrate. In some implementations, the substrate is a glass substrate. In some implementations, the substrate includes a dielectric (e.g., laminated substrate that includes several dielectric layers). The substrate may be a singular piece of substrate that is cut from a wafer in some implementations. In some implementations, providing (at 1405) the substrate may include providing a wafer.

The method provides (at 1410) a first passive device (e.g., coupling inductor). The first passive device is provided in the substrate. The first passive device includes a first set of through substrate vias (TSVs). In some implementations, the first passive device includes a first set of interconnects (e.g., metal traces) and/or a second set of interconnects (e.g., metal traces). The first set of interconnects is on a first surface (e.g., top surface) of the substrate. The second set of interconnects is on a second surface (e.g., bottom surface) of the substrate. In some implementations, providing (at 1410) the first passive device includes providing the first set of TSVs, the first set of interconnects (e.g., on the first surface of the substrate), and/or the second set of interconnects (e.g., on the second surface of the substrate). FIG. 5 illustrates an example of how interconnects on a first surface of the substrate, interconnects on a second surface of the substrate, and TSVs may be coupled to form/define an exemplary first passive device.

In some implementations, providing the vias (e.g., TSV) includes providing at least one cavity in the substrate and/or wafer. Different implementations may provide at least one cavity by using different techniques and processes. In some implementations, providing at least one cavity includes using a laser to drill at least one cavity (e.g., cavity 1301) in the substrate (e.g., substrate 1302). In some implementations, providing at least one cavity includes pattern etching (e.g., lithography, chemical process, dry etching, wet etching). In the instance that multiple cavities are provides in the substrate, the cavities may be provided/created sequentially or concurrently in the substrate and/or wafer.

In some implementations, providing at least one via (e.g., TSV) includes filling one or more the cavities with a metal material (e.g., copper) to define one or more vias in the substrate. In some implementations, the one or more vias (e.g., TSVs) is provided in the substrate such that an oxidation layer is between the via (e.g., TSVs) and the substrate. The oxidation layer (e.g., oxidation layer 1304) is configured to provide electrical insulation between the via and the substrate. Different implementations may provide the one or more vias differently.

In some implementations, providing one or more vias (e.g., TSVs) includes providing a masking layer (e.g., masking layer 1306) on the interposer. Specifically, a masking layer (e.g., patterned mask layer) is provided on the oxidation layer that is on the substrate. Different implementations may use different materials and methods for providing for the masking layer.

In some implementations, providing one or more vias (e.g., TSVs) also includes selectively etching one or more portions of the masking layer to provide a patterned mask layer. Different implementations may use different methods for selectively etch the masking layer. In some implementations, lithography may be used to selectively etch the masking layer, which forms patterns/cavities that define the outline of one or more vias or portions of one or more vias.

In some implementations, providing one or more vias (e.g., TSVs) also includes providing a material (e.g., metal material) in the patterns/cavities. The material defines the one or more vias in the substrate of the interposer. Different implementations may provide the material differently. In some implementations, the material (e.g., metal layer) may be deposited, plated and/or pasted in the patterns/cavities.

In some implementations, providing one or more vias (e.g., TSVs) also includes removing the masking layer (e.g., patterned mask layer), leaving an interposer with an oxidation layer and one or more vias. In some implementations, removing the masking layer may include removing a portion of an electroless seed layer.

The method provides (at 1415) a second passive device (e.g., coupling inductor). The second passive device is provided in/on the substrate. In some implementations, the second passive device includes a second set of through substrate vias (TSVs). In some implementations, the second passive device includes a first set of interconnects (e.g., metal traces) and/or a second set of interconnects (e.g., metal traces). The first set of interconnects is on a first surface (e.g., top surface) of the substrate. The second set of interconnects is on a second surface (e.g., bottom surface) of the substrate. In some implementations, providing (at 1410) the second passive device includes providing the second set of TSVs, the first set of interconnects, and/or the second set of interconnects. FIG. 5 illustrates an example of how interconnects on a first surface of the substrate, interconnects on a second surface of the substrate, and TSVs may be coupled to form/define an exemplary second passive device.

In some implementations, when the substrate that is provided (at 1405) is a wafer, the method may cut (e.g., after 1415) the wafer into singular pieces of integrated devices (e.g., interposer 204) using known cutting/dicing techniques and processes.

Figure 15:
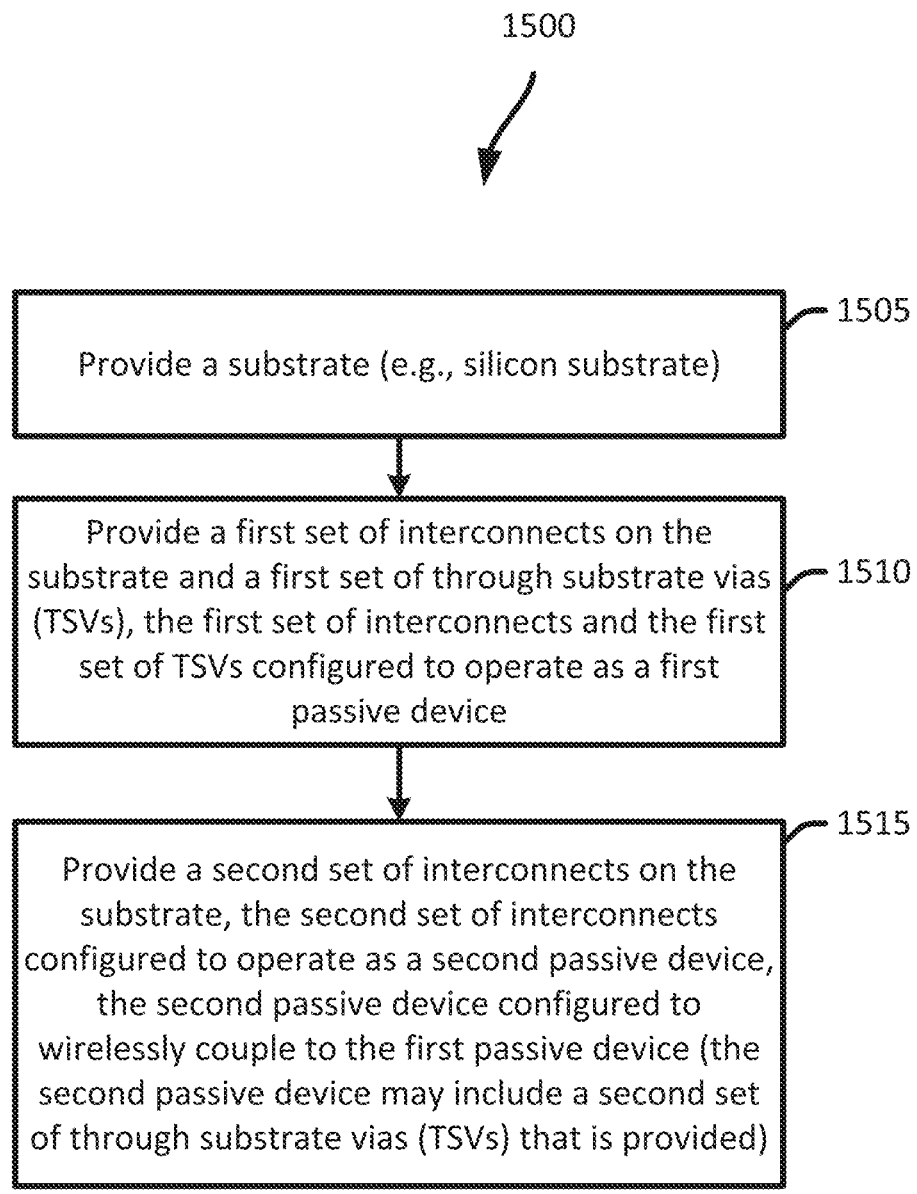
FIG. 15 illustrates another method for providing/manufacturing an interposer that includes a passive device.

Exemplary Method for Providing/Manufacturing an Interposer that Includes Wireless Interconnects FIG. 15 illustrates another exemplary method for providing/manufacturing an integrated device (e.g., interposer) that includes a wireless interconnect. Specifically, FIG. 15 illustrates a sequence for providing/manufacturing an integrated device (e.g., interposer) that includes at least one passive device (e.g., inductor, passive means, inductive means), where the passive device includes a through substrate via (TSV).

In some implementations, the method of FIG. 15 may be used to provide/manufacture the integrated devices (e.g., interposers) of FIGS. 2, 3, 4, 6, and/or 13A-13C, as well as other integrated devices (e.g., interposers) described in the present disclosure. As shown in FIG. 15, the method provides (at 1505) a substrate. In some implementations, the substrate is a silicon substrate. In some implementations, the substrate is a glass substrate. In some implementations, the substrate includes a dielectric (e.g., laminated substrate that includes several dielectric layers). The substrate may be a singular piece of substrate that is cut from a wafer in some implementations. In some implementations, providing (at 1505) the substrate may include providing a wafer.

The method provides (at 1510) a first set of interconnects on the substrate, and a first set of through substrate vias (TSVs). The first set of interconnects (e.g., first set of traces) and the first set of TSVs are configured to operate as a first passive device (e.g., coupling inductor). In some implementations, the first set of interconnects may be provided on a first surface (e.g., bottom surface) or a second surface (e.g., top surface) of the substrate. In some implementations, the first passive device may include another set of interconnects (e.g., third set of interconnects). The third set of interconnects may be provided on a second surface (e.g., top surface) of the substrate. The third set of interconnects is coupled to the first set of interconnects though the first set of TSVs in some implementations. FIG. 5 illustrates an example of how interconnects on a first surface of the substrate, interconnects on a second surface of the substrate, and TSVs may be coupled.

In some implementations, providing the vias (e.g., TSV) includes providing at least one cavity in the substrate and/or wafer. Different implementations may provide at least one cavity by using different techniques and processes. In some implementations, providing at least one cavity includes using a laser to drill at least one cavity (e.g., cavity 1301) in the substrate (e.g., substrate 1302). In some implementations, providing at least one cavity includes pattern etching (e.g., lithography, chemical process, dry etching, wet etching). In the instance that multiple cavities are provides in the substrate, the cavities may be provided/created sequentially or concurrently in the substrate and/or wafer.

In some implementations, providing at least one via (e.g., TSV) includes filling one or more the cavities with a metal material (e.g., copper) to define one or more vias in the substrate. In some implementations, the one or more vias (e.g., TSVs) is provided in the substrate such that an oxidation layer is between the via (e.g., TSVs) and the substrate. The oxidation layer (e.g., oxidation layer 1304) is configured to provide electrical insulation between the via and the substrate. Different implementations may provide one or more vias differently.

In some implementations, providing one or more vias (e.g., TSVs) includes providing a masking layer (e.g., masking layer 1306) on the interposer. Specifically, a masking layer (e.g., patterned mask layer) is provided on the oxidation layer that is on the substrate. Different implementations may use different materials and methods for providing for the masking layer.

In some implementations, providing one or more vias (e.g., TSVs) also includes selectively etching one or more portions of the masking layer to provide a patterned mask layer. Different implementations may use different methods for selectively etch the masking layer. In some implementations, lithography may be used to selectively etch the masking layer, which forms patterns/cavities that define the outline of one or more vias or portions of one or more vias.

In some implementations, providing one or more vias (e.g., TSVs) also includes providing a material (e.g., metal material) in the patterns/cavities. The material defines the one or more vias in the substrate of the interposer. Different implementations may provide the material differently. In some implementations, the material (e.g., metal layer) may be deposited, plated and/or pasted in the patterns/cavities.

In some implementations, providing one or more vias (e.g., TSVs) also includes removing the masking layer (e.g., patterned mask layer), leaving an interposer with an oxidation layer and one or more vias. In some implementations, removing the masking layer may include removing a portion of an electroless seed layer.

The method provides (at 1515) a second set of interconnects on the substrate. The second set of interconnects is configured to operate as a second passive device (e.g., coupling inductor). In some implementations, the second passive device is configured to wirelessly couple to the first passive device. In some implementations, the second set of interconnects may be provided on the first surface (e.g., bottom surface) or the second surface (e.g., top surface) of the substrate. In some implementations, the second passive device includes a second set of through substrate vias (TSVs). As such, in some implementations, the method may further provide a second set of TSVs. In some implementations, the second passive device includes a fourth set of interconnects (e.g., metal traces) on the first surface (e.g., bottom surface) of the substrate. As such, in some implementations, the method may further provide a fourth set of interconnects. In some implementations, the fourth set of interconnects is coupled to the second set of interconnects through the second set of TSVs. FIG. 5 illustrates an example of how interconnects on a first surface of the substrate, interconnects on a second surface of the substrate, and TSVs may be coupled.

In some implementations, when the substrate that is provided (at 1505) is a wafer, the method may cut (e.g., after 1515) the wafer into singular pieces of integrated devices (e.g., interposer 204) using known cutting/dicing techniques and processes.

Exemplary Circuit Diagram of Wireless Coupling/Communication

Figure 16:
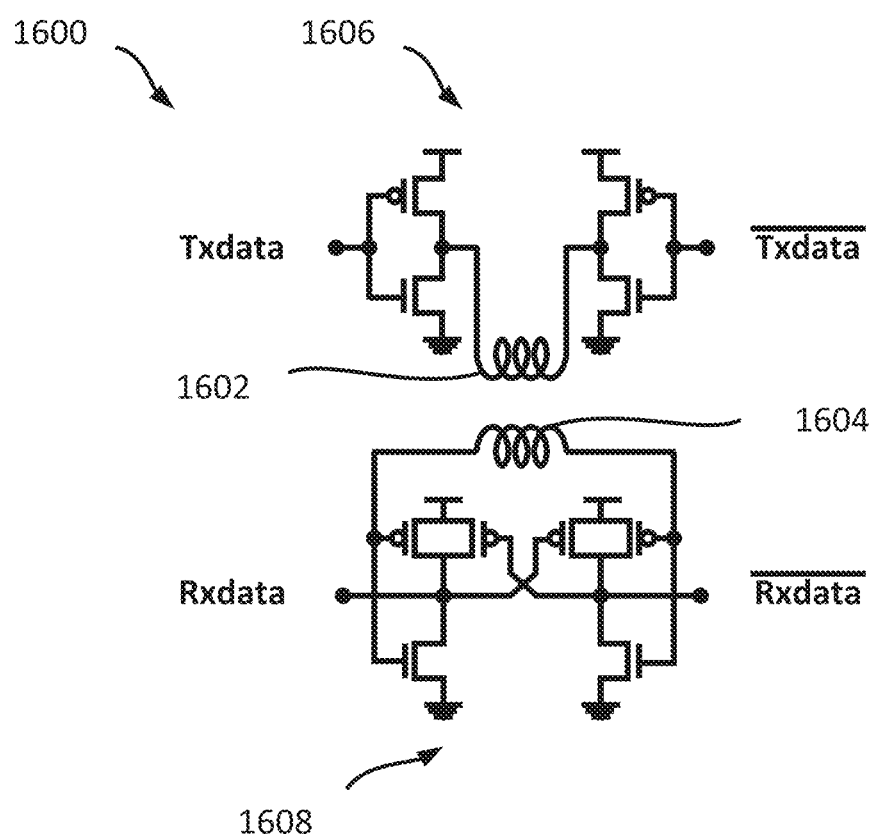
FIG. 16 illustrates a circuit diagram of active devices coupled to passive devices.

As mentioned above, in some implementations, passive devices provide a means for two dies to wirelessly communicate with each other. FIG. 16 illustrates an exemplary circuit diagram of how two dies may wireless communicate with each other by using passive devices and active devices.

FIG. 16 illustrates a circuit diagram 1600 that includes a first passive device 1602, a second passive device 1604, a transmitter, 1606 (e.g., active device, active means), and a receiver 1608 (e.g., active device, active means). The first passive device 1602 is a first inductor. The second passive device 1604 is a second inductor. As shown in FIG. 16, the first passive device 1602 is coupled (e.g., inductively coupled) to the second passive device 1604.

The transmitter 1606 is a transmitting circuit that includes a digital inverter in some implementations. In some implementations, the digital inverter provides a current to the first passive device 1602. In some implementations, the current in the first passive device 1602 may induce a voltage in the second passive device 1604. In some implementations, the receiver 1608 is a receiver circuit that includes a pulse detector. In some implementations, the pulse detector detects voltage pulses generated from the second passive device 1604. Thus, in some implementations, wireless communication may occur between two dies by providing various currents in a first passive device (e.g., passive device 1602), which induces various voltages in a second passive device (e.g. passive device 1604). It should be noted that different implementations may use different transmitters and/or receivers.

Exemplary Electronic Devices

Figure 17:
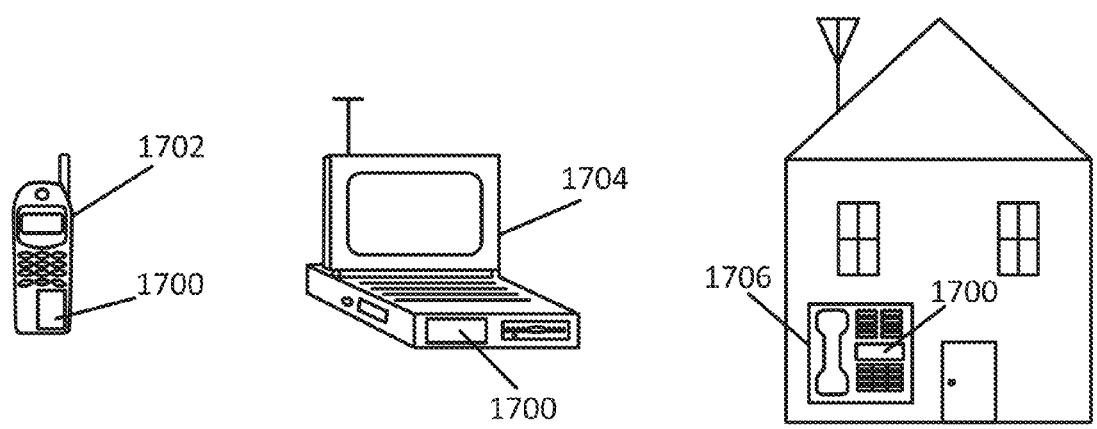
FIG. 17 illustrates various electronic devices that may integrate an integrated circuit and/or PCB described herein.

FIG. 17 illustrates various electronic devices that may be integrated with any of the aforementioned integrated circuit, die or package. For example, a mobile telephone 1702, a laptop computer 1704, and a fixed location terminal 1706 may include an integrated circuit (IC) 1700 as described herein. The IC 1700 may be, for example, any of the integrated circuits, dice or packages described herein. The devices 1702, 1704, 1706 illustrated in FIG. 17 are merely exemplary. Other electronic devices may also feature the IC 1700 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7, 8, 9, 10, 11, 12, 13A-13C, 14, 15, 16 and/or 17 may be rearranged and/or combined into a single component, step, feature or function or embodied in several components, steps, or functions. Additional elements, components, steps, and/or functions may also be added without departing from the invention.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An interposer comprising:
    a substrate;
    a first passive device in the substrate, the first passive device comprising a first set of through substrate vias (TSVs) in the substrate; and
    a second passive device configured to inductively couple to the first passive device, the second passive device comprising a second set of TSVs in the substrate, the first set of TSVs and the second set of TSVs positioned laterally to each other in the same layer of the substrate.

2. The interposer of claim 1, wherein the second passive device is in the substrate.

3. The interposer of claim 1, wherein the second passive device is configured to inductively laterally couple to the first passive device.

4. The interposer of claim 1, wherein the second passive device is configured to inductively vertically couple to the first passive device.

5. The interposer of claim 1, wherein the second passive device is positioned laterally to the first passive device in the substrate.

6. The interposer of claim 1, wherein the second passive device is positioned vertically to the first passive device in the substrate.

7. The interposer of claim 1, wherein the first passive device is a first inductor and the second passive device is a second inductor.

8. The interposer of claim 1, further comprising:
a first set of interconnects coupled to the first set of TSVs, the first set of interconnects configured to be coupled to a first die; and
a second set of interconnects coupled to the second set of TSVs, the second set of interconnects configured to be coupled to a second die.

9. The interposer of claim 1, further comprising:
a first die coupled to the substrate; and
a second die coupled to the substrate, the second die electrically coupled to the first die through the first and second set of TSVs.

10. The interposer of claim 9, further comprising:
a first active device coupled to the first die, the first active device configured to transmit a signal; and
a second active device coupled to the second die, the second active device configured to receive the signal from the first active device.

11. The interposer of claim 10, wherein the first active device is one of at least a transmitter, receiver and/or transceiver.

12. The interposer of claim 1, wherein the interposer is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

13. An apparatus comprising:
a substrate;
a first passive means in the substrate, the first passive means comprising a first set of through substrate vias (TSVs) in the substrate; and
a second passive means configured to inductively couple to the first passive means, the second passive means comprising a second set of TSVs in the substrate, the first set of TSVs and the second set of TSVs positioned laterally to each other in the same layer of the substrate.

14. A method for providing an interposer, comprising:
providing a substrate;
providing a first set of interconnects on the substrate and a first set of through substrate vias (TSVs) in the substrate, the first set of interconnects and the first set of TSVs configured to operate as a first passive device in the substrate; and
providing a second set of interconnects on the substrate and a second set of TSVs in the substrate, the second set of interconnects and he second set of TSVs configured to operate as a second passive device, the second passive device configured to inductively couple to the first passive device and the first set of TSVs and the second set of TSVs positioned laterally to each other in the same layer of the substrate.

15. The method of claim 14, wherein the second passive device is configured to inductively laterally couple to the first passive device.

16. The method of claim 14, wherein the second passive device is configured to inductively vertically couple to the first passive device.

17. The method of claim 14, wherein the interposer is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *